(12) United States Patent
Huang et al.

(10) Patent No.: US 6,624,460 B1
(45) Date of Patent: Sep. 23, 2003

(54) MEMORY DEVICE WITH LOW RESISTANCE BURIED BIT LINES

(75) Inventors: Weng-Hsing Huang, Hsinchu (TW); Kent Kuohua Chang, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/064,764

(22) Filed: Aug. 15, 2002

(51) Int. Cl.⁷ .............................................. H01L 31/119
(52) U.S. Cl. ....................................... 257/296; 257/905
(58) Field of Search ................................. 257/296, 905, 257/306, 302, 310, 311; 365/63, 51

(56) References Cited

U.S. PATENT DOCUMENTS 5,796,136 A * 8/1998 Shinkawata ................. 257/306
6,355,520 B1 * 3/2002 Park et al. ................... 438/253
6,496,402 B1 * 12/2002 Somasekhar et al. ......... 365/63

\* cited by examiner

*Primary Examiner*—David Nelms
*Assistant Examiner*—Thinh T. Nguyen
(74) *Attorney, Agent, or Firm*—Jiang Chyun IP Office

(57) ABSTRACT

A memory device and a method for fabricating the same are described. The memory device includes a substrate, buried bit lines, word line structures, a dielectric layer, conductive lines in trenches and self-aligned contacts. The buried bit lines are located in the substrate, and the word line structures are disposed on the substrate crossing over the buried bit lines. Each word line structure consists of a word line, a gate oxide layer, a capping layer and a spacer. Each conductive line is disposed in the dielectric layer and over a buried bit line, and crosses over the capping layers. The dielectric layer is disposed between the word line structures and between the conductive lines. Each self-aligned contact is disposed under a conductive line and between two adjacent word lines to electrically connect the conductive line and the corresponding buried bit line.

6 Claims, 5 Drawing Sheets

MEMORY DEVICE WITH LOW RESISTANCE BURIED BIT LINES

BACKGROUND OF INVENTION

1. Field of Invention

The present invention relates to a memory device and a method for fabricating the same. More particularly, the present invention relates to a memory device that has a dual damascene structure with a self-aligned contact and therefore has higher reliability, and relates to a method for fabricating the memory device.

2. Description of Related Art

Memory device is a semiconductor device for storing digital data, and the size of a memory chip is usually expressed in bits. A memory device is constituted by rows and columns of memory cells, each of which stores one bit of data and has a specific address according to its location, i.e., the numbers of the row and the column where the memory cell is located. In a memory device, the memory cells in the same row/column are coupled to one conductive line.

FIG. 1 illustrates a perspective view of a memory device in the prior art.

Refer to FIG. 1, a method for fabricating the memory device is described below. A gate oxide layer 102 is formed on a substrate 100, and then buried bit lines 104 are formed in the substrate 100. Insulating oxide layers 106 are formed on the buried bit lines 104. Word lines 108 are then formed on the substrate 100 crossing over the buried bit lines 104 and the insulating oxide layers 106, wherein the word lines 108 are isolated from the buried bit lines 104 by the insulating oxide layers 106.

As the areas of memory devices are reduced in accompany with higher integration of semiconductor devices, the width of buried bit lines has to be decreased. However, the miniaturization of the buried bit lines increases the resistance thereof, and the increased resistance causes overloading of the buried bit lines. The overloading problem can be solved by increasing the junction depth of the buried bit lines, but such a method results in short channel effect and junction leakage. On the other hand, the source/drain can be formed with a shallower junction and a higher dopant concentration to avoid overloading, short channel effect and junction leakage, and to lower the resistance simultaneously. However, the strategy is usually not effective in preventing overloading because of the restriction of solid state solubility. Moreover, in a conventional memory device, a bit line contact is formed on a buried bit line every 32 or 64 memory cells. However, the incorporation of the bit line contacts limits the integration of the memory device. Therefore, it is very important to decrease the number of the bit line contacts in order to increase the integration of the memory device.

SUMMARY OF INVENTION

Accordingly, this invention provides a memory device and a method for fabricating the same to lower the resistance of buried bit lines.

This invention also aims to decrease the required junction depth of buried bit lines for preventing short channel effect and punch-through leakage.

This invention further aims to decrease the number of bit line contacts in a memory device for increasing the integration of the memory device.

A memory device of this invention comprises rows and columns of memory cells. The memory device comprises a substrate, a plurality of buried bit lines, a plurality of word line structures, a dielectric layer, a plurality of conductive lines in trenches and a plurality of self-aligned contacts. The buried bit lines are located in the substrate, and the word line structures are disposed on the substrate crossing over the buried bit lines. Each word line structure consists of a word line, a gate oxide layer under the word line, a capping layer on the top of the word line, and a spacer on the sidewalls of the capping layer and the word line. Each conductive line is disposed in the dielectric layer and over one buried bit line, and crosses over the capping layers. The dielectric layer is disposed between the word line structures and between the conductive lines, that is, the conductive lines are isolated from each other by the dielectric layer. Each self-aligned contact is disposed under a conductive line and between two adjacent word line structures to electrically connect the conductive line and the corresponding buried bit line. In this invention, a conductive line and the buried bit line located under it together serve as a bit line.

A method for fabricating a memory device of this invention comprises the following steps. A buried bit line is formed in a substrate, and then a gate oxide layer is formed on the substrate. A word line having a capping layer thereon is formed on the gate oxide layer, and a spacer is formed on the sidewalls of the capping layer and the word line. A dielectric layer is formed on the substrate covering the capping layers, and then patterned to form a trench over the buried bit line exposing a portion of the capping layer. A self-aligned contact opening, which constitutes a dual damascene opening with the trench, is then formed in the dielectric layer under the trench to expose a portion of the buried bit line. In the step of forming the trench and the self-aligned contact opening, the etching rates of the capping layer and the spacer both are lower than that of the dielectric layer so that the word line is not damaged. Thereafter, a conductive material is filled into the dual damascene opening to form a dual damascene structure consisting of a conductive line in the trench and a self-aligned contact in the self-aligned contact opening. The conductive line and the buried bit line together constitute a bit line and are electrically connected via the self-aligned contact. Besides, it is also feasible to form the trench after the self-aligned contact opening is formed.

Since a bit line is constituted by a buried bit line and a conductive line in this invention, the resistance of the bit line is lower. Because of that, the buried bit line can be formed with a shallower junction to prevent short channel effect and junction leakage and improve the reliability of the memory device. Meanwhile, the voltage drop of the bit line can be reduce, so the number of bit line contacts can be decreased to increase the integration of the memory device.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
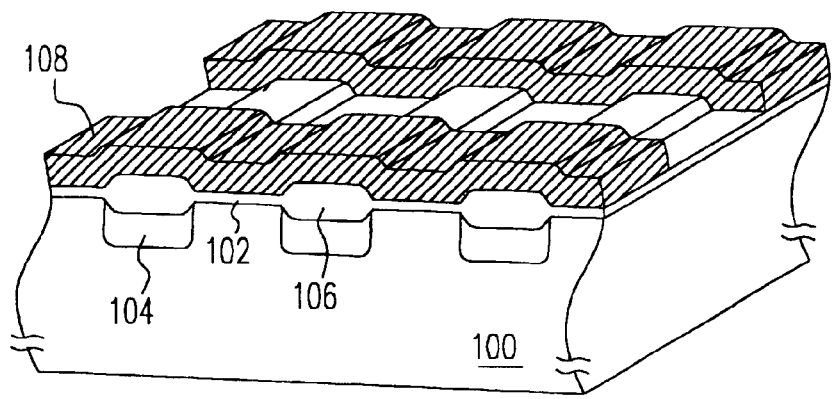
FIG. 1 illustrates a perspective view of a memory device in the prior art.
Figure 2:
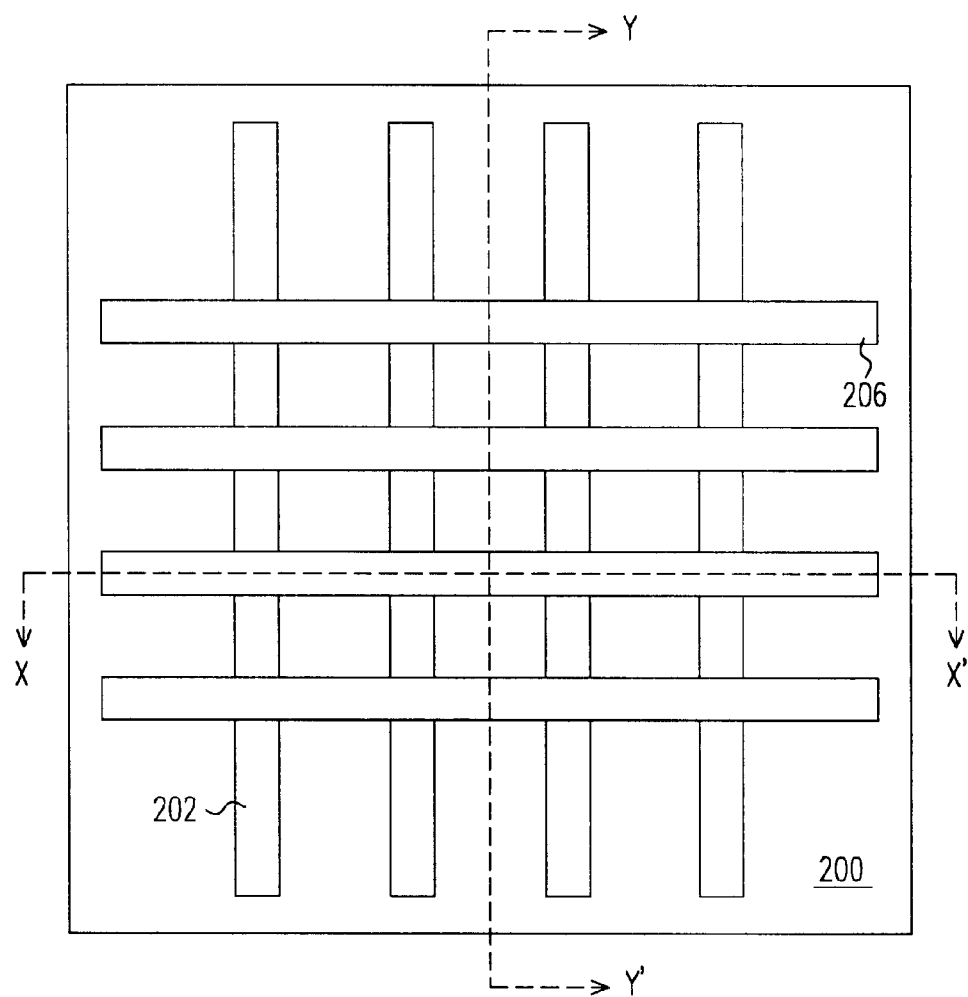
FIG. 2 schematically illustrates a top view of a memory device according to a preferred embodiment of this invention.

FIG. 2 schematically illustrates a top view of the memory device according to the preferred embodiment of this invention. FIGS. 3A–3E schematically illustrate a process flow of fabricating a memory device according to the preferred embodiment of this invention in a cross-sectional view.

Figure 3A:
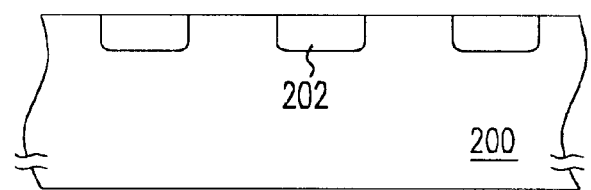
FIGS. 3A–3E schematically illustrate a process flow of fabricating a memory device according to the preferred embodiment of this invention in a cross-sectional view.

Refer to FIGS. 2 and 3A, wherein FIG. 3A illustrates a cross-sectional view of the memory device in FIG. 2 along line X–X". A buried bit line 202 is formed in the substrate 200 by, for example, forming a patterned photoresist layer (not shown) on the substrate 200, and then performing an ion implantation with the patterned photoresist layer as a mask.

Figure 3B:
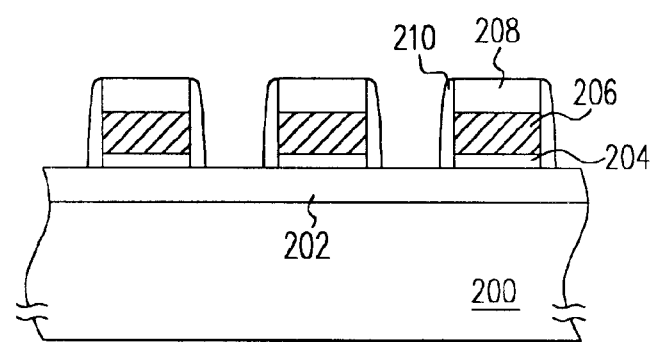

Refer to FIGS. 2 and 3B, wherein FIG. 3B illustrates a cross-sectional view of the memory device in FIG. 2 along line Y–Y". A gate oxide layer 204 is formed on the substrate 200 after the buried bit line 202 is formed, and then a plurality of word lines 206 each having a capping layer 208 thereon is formed on the gate oxide layer 204. The word lines 206 comprise a material such as polysilicon, and the capping layers 208 comprise, for example, silicon nitride or silicon oxynitride. The method for forming the gate oxide layer 204, the word line 206 and the capping layer 208 comprises, for example, the following steps. A thin oxide layer is formed on the substrate 200 by using thermal oxidation, and then a conductive layer and a material layer are sequentially formed on the thin oxide layer. The material layer and the conductive layer are patterned into the capping layers 208 and the word lines 206, respectively, and then the exposed thin oxide layer is removed to form the gate oxide layer 204.

Thereafter, a spacer 210 is formed on the sidewalls of the word line 206 and the capping layer 208 by, for example, forming a conformal material layer (not shown) on the substrate 200 and then etching back the conformal material layer. The spacer 210 comprises a material such as silicon nitride or silicon oxynitride.

Figure 3C:
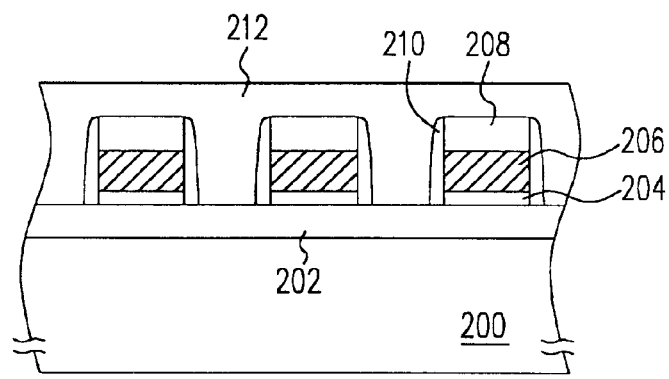

Refer to FIG. 3C, a dielectric layer 212 is formed on the substrate 200 covering the capping layers 208 and the spacers 210. The dielectric layer 212 comprises a material different from those of the capping layers 208 and the spacers 210, such as silicon oxide, and is formed with chemical vapor deposition (CVD), for example.

Figure 3D:
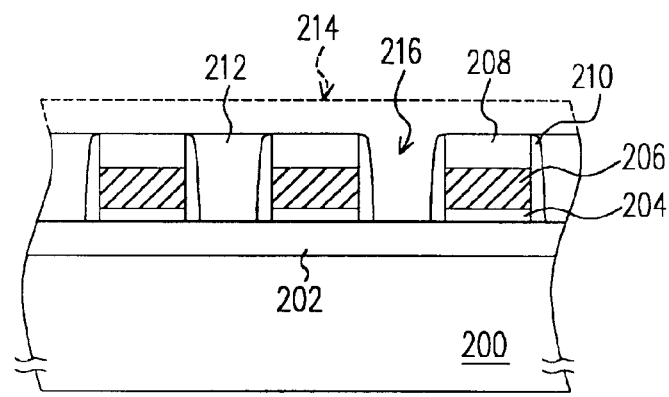

Refer to FIG. 3D, an etching process is performed to pattern the dielectric layer 212 to form a trench 214 over the buried bit line 202 until the tops of the capping layers 208 are exposed. In the etching process, the etching rate of the capping layer 208 is much smaller than that of the dielectric layer 212 to protect the word line 206 from being exposed. A self-aligned contact opening 216, which constitutes a dual damascene opening with the trench 214, is then formed in the dielectric layer 212 under the trench 214 and between two adjacent word lines 206 to expose a portion of the buried bit line 202. In the etching process for forming the self-aligned contact opening 216, the etching rate of the spacers 210 is much smaller than that of the dielectric layer 212 to protect the word lines 206 from being exposed.

As mentioned above, since a capping layer 208 and a spacer 210 are formed on the top and on the sidewalls, respectively, of a word line 206, the self-aligned contact opening 216 can be formed easily.

Besides, it is also feasible to form the trench 214 after the self-aligned contact opening 216 is formed. In detail, a self-aligned contact opening 216 is formed firstly in the dielectric layer 212 and between two adjacent word lines 206 to expose a portion of the buried bit line 202. Then, the trench 214 is formed in the dielectric layer 212 over the buried bit line 202 and traversing the self-aligned contact opening 216, and exposing the tops of the capping layers 208.

Figure 3E:
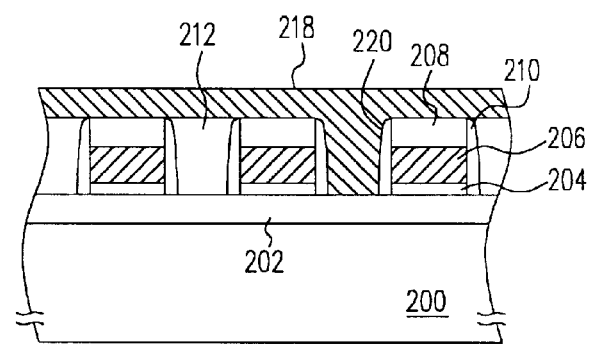

Refer to FIG. 3E, a conductive material, such as copper or tungsten, is filled into the dual damascene opening to form a dual damascene structure including a conductive line 218 in trench and a self-aligned contact 220. The dual damascene opening is filled by, for example, forming a conductive layer all over the substrate 200 and then removing the conductive layer outside the dual damascene opening with etching-back or chemical mechanical polishing (CMP).

It is noted that the buried bit line 202 is electrically connected to the line 218 via the self-aligned contact 220, so the buried bit line 202 and the conductive line 218 in trench together serve as a bit line in this invention. Therefore, the resistance of the bit line is lower. Because of that, the buried bit line can be formed with a shallower junction to prevent short channel effect and junction leakage and improve the reliability of the device.

Figure 4:
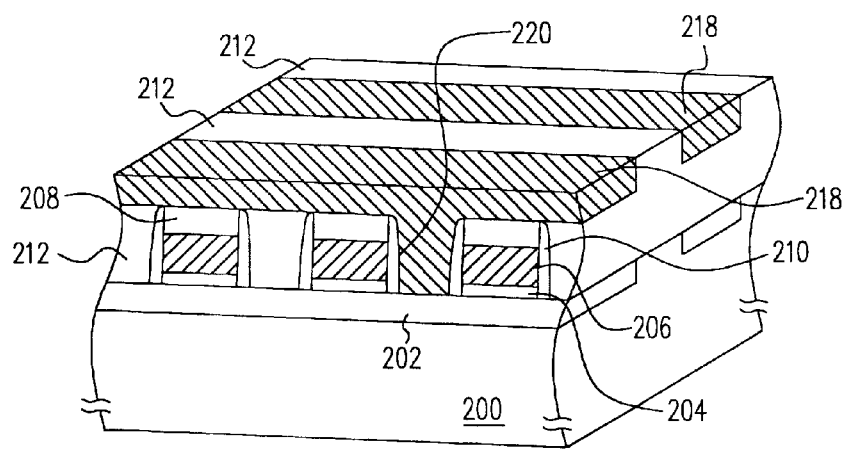
FIG. 4 illustrates a perspective view of the memory device according to the preferred embodiment of this invention.

FIG. 4 illustrates a perspective view of the memory device according to the preferred embodiment of this invention.

Refer to FIG. 4, the memory device comprises a plurality of memory cells arranged into an array. The memory device comprises a substrate 200, a plurality of buried bit lines 202, a plurality of word lines 206, a dielectric layer 212, a plurality of conductive lines 218 in trenches and a plurality of self-aligned contacts 220. Each word line 206 is disposed with a gate oxide layer 204, a capping layer 208 and a spacer 210.

As shown in FIG. 4, the buried bit lines 202 are located in the substrate 200, and the word lines 206 are disposed on the substrate 200 crossing over the buried bit lines 202. The gate oxide layer 204 is disposed between a word line 206 and the substrate 200. A capping layer 208 and a spacer 210 are disposed on the top and the sidewalls, respectively, of a word line 206 to protect the word line 206 from being exposed during the etching process for forming the dual damascene opening.

Each conductive line 218 is located over a buried bit line 202 and crosses over the capping layers 208, and the dielectric layer 212 is located between the conductive lines 218 and between the word lines 206 for isolation. A self-aligned contact 220 is disposed under a conductive line 218 and between two adjacent word lines 206 to electrically connect the conductive line 218 and the corresponding buried bit line 202. Therefore, the conductive line 218 and the buried bit line 202 together serve a bit line in this invention.

Since a bit line is constituted by a buried bit line 202 and a conductive line 218 in this invention, the resistance of the bit line is lower. Because of that, the buried bit line can be formed with a shallower junction to prevent short channel effect and junction leakage and improve the reliability of the device. Meanwhile, the voltage drop of the bit line can be reduced, so the number of bit line contacts can be decreased to increase the integration of the memory device.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A memory device, comprising:

a substrate;

a plurality of buried bit lines in the substrate;

a plurality of word lines on the substrate crossing over the buried bit lines;

a gate oxide layer disposed between the substrate and the word lines;

a capping layer on each word line;

a spacer on sidewalls of each word line;

a plurality of conductive lines located over the buried bit lines and crossing over the capping layer;

a dielectric layer between the word lines and between the conductive lines; and a plurality of self-aligned contacts each disposed under a conductive line and between two adjacent word lines to electrically connect the conductive line and a buried bit line.

2. The memory device of claim 1, wherein the capping layer comprises silicon nitride or silicon oxynitride.

3. The memory device of claim 1, wherein the spacer comprises silicon nitride or silicon oxynitride.

4. The memory device of claim 1, wherein the dielectric layer comprises silicon oxide.

5. The memory device of claim 1, wherein the conductive lines and the self-aligned contacts comprise copper or tungsten.

6. The memory device of claim 1, wherein the word lines comprise polysilicon.

* * * * *